(12) United States Patent
Perrin et al.

(10) Patent No.: US 10,111,360 B2
(45) Date of Patent: Oct. 23, 2018

(54) ELECTRICAL CABINET WITH IMPROVED HEAT DISSIPATION

(71) Applicant: SCHNEIDER ELECTRIC INDUSTRIES SAS, Rueil Malmaison (FR)

(72) Inventors: Alain Perrin, Saint Nicolas de Macherin (FR); Frederic Waterlot, Saint Baldoph (FR); Louis Linares, La Terrasse (FR); Pascal Lepretre, Les Marches (FR); Josep Lopez, Barcelona (ES)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 428 days.

(21) Appl. No.: 14/351,380

(22) PCT Filed: Nov. 26, 2012

(86) PCT No.: PCT/EP2012/073563
§ 371 (c)(1),
(2) Date: Apr. 11, 2014

(87) PCT Pub. No.: WO2013/083421
PCT Pub. Date: Jun. 13, 2013

(65) Prior Publication Data
US 2014/0246169 A1 Sep. 4, 2014

(30) Foreign Application Priority Data

Dec. 5, 2011 (FR) ...................................... 11 61128

(51) Int. Cl.
*H05K 7/20* (2006.01)
*H02B 1/56* (2006.01)

(52) U.S. Cl.
CPC ......... *H05K 7/20009* (2013.01); *H02B 1/565* (2013.01); *H05K 7/206* (2013.01); *H05K 7/2089* (2013.01); *H05K 7/20545* (2013.01)

(58) Field of Classification Search
CPC ........... H05K 7/20009; H05K 7/20545; H05K 7/206; H05K 7/2089; H02B 1/565
(Continued)

(56) References Cited

U.S. PATENT DOCUMENTS

| 3,364,838 | A | * | 1/1968 | Bradley | ................. | A47B 81/00 |
| | | | | | | 165/80.3 |
| 3,559,728 | A | * | 2/1971 | Lyman | .................. | H05K 7/206 |
| | | | | | | 165/122 |

(Continued)

FOREIGN PATENT DOCUMENTS

| DE | 91 11 434 | 12/1991 |
| DE | 103 56 424 | 6/2005 |
| DE | 10 2004 030 675 | 11/2005 |

OTHER PUBLICATIONS

International Search Report dated Jan. 18, 2013 in PCT/EP12/073563 Filed Nov. 26, 2012.

*Primary Examiner* — Jianying Atkisson
*Assistant Examiner* — Raheena R Malik
(74) *Attorney, Agent, or Firm* — Oblon, McClelland, Maier & Neustadt, L.L.P.

(57) ABSTRACT

An electrical cabinet for receiving functional electrical units, each including a plurality of electrical devices arranged on a bracket; and a mechanism for attaching the functional electrical units, the attaching mechanism configured to receive the functional electric units along a separation plane defining a first space located toward a front portion, and a second space located toward a back portion; a partition dividing the second space into a first subspace located toward the front portion and a second subspace located (Continued)

toward the rear portion, the partition configured in the electrical cabinet to form at least two passages enabling an airflow to circulate between the first subspace and the second subspace; and a cooling source arranged to be in contact with the airflow.

12 Claims, 6 Drawing Sheets

(58) Field of Classification Search
USPC .............................................. 165/47, 58, 59
See application file for complete search history.

(56) References Cited

U.S. PATENT DOCUMENTS

| | | | | |
|---|---|---|---|---|
| 6,088,225 A * | 7/2000 | Parry | ....................... | H02B 1/50 |
| | | | | 165/104.33 |
| 6,149,254 A * | 11/2000 | Bretschneider | ........ | H05K 7/206 |
| | | | | 312/213 |
| 6,164,369 A * | 12/2000 | Stoller | ................... | H05K 7/206 |
| | | | | 165/104.33 |
| 6,252,775 B1 * | 6/2001 | Kuroda | ................. | H05K 1/053 |
| | | | | 361/707 |
| 6,341,064 B1 * | 1/2002 | Bradley | ................. | H02B 1/565 |
| | | | | 361/695 |
| 6,538,883 B1 | 3/2003 | Greer | | |
| 6,704,198 B2 * | 3/2004 | Replogle | ................ | H05K 7/206 |
| | | | | 165/104.33 |
| 6,742,583 B2 * | 6/2004 | Tikka | ..................... | H05K 7/206 |
| | | | | 165/261 |
| 6,804,114 B1 | 10/2004 | Greer | | |
| 6,834,715 B2 * | 12/2004 | Garcia | ................ | H01M 10/615 |
| | | | | 165/263 |
| 6,877,551 B2 * | 4/2005 | Stoller | ................... | H02B 1/565 |
| | | | | 165/122 |
| 6,889,752 B2 * | 5/2005 | Stoller | ................... | H05K 7/206 |
| | | | | 165/122 |
| 7,752,858 B2 * | 7/2010 | Johnson | ............. | H05K 7/20836 |
| | | | | 361/695 |
| 7,878,888 B2 * | 2/2011 | Rasmussen | ........ | H05K 7/20572 |
| | | | | 361/695 |
| 8,144,464 B2 * | 3/2012 | VanDerVeen | ...... | H05K 7/20736 |
| | | | | 165/104.34 |
| 2003/0094266 A1 * | 5/2003 | Fritsch | ................... | H02B 1/565 |
| | | | | 165/135 |
| 2009/0227197 A1 * | 9/2009 | Lewis, II | ........... | H05K 7/20736 |
| | | | | 454/284 |
| 2012/0168141 A1 * | 7/2012 | Lin | ..................... | H05K 7/20736 |
| | | | | 165/276 |

* cited by examiner

ELECTRICAL CABINET WITH IMPROVED HEAT DISSIPATION

TECHNICAL FIELD OF THE INVENTION

The present invention relates to an electrical cabinet with improved heat dissipation.

STATE OF THE ART

The document referenced DE102009054011A1 discloses an electrical cabinet offering a solution for improving the cooling of the electrical devices housed in the electrical cabinet. This solution consists:
- in dividing the cabinet into two spaces, a first space situated toward the front, comprising electrical devices to be cooled, and a second space situated toward the rear and comprising an intake for cold air coming from outside and a ventilation system making it possible to effectively circulate this cold air coming from outside, and,
- in forming openings between the different electrical devices to enable the cold airflow to pass from the second space to the first space and sweep over all the electrical devices. The openings are, for example, prolonged by gutters in order to bring the airflow as close as possible to the area of the electrical device to be cooled.

This solution requires an opening to the outside to be produced, and is therefore not suited to a tight cabinet, for example conforming to the standard IEC 60529 with an index of IP55. Furthermore, in this solution, all the parts of the electrical devices are intended to be at one and the same temperature whereas all the electrical devices do not necessarily require the same level of cooling.

The aim of the invention is therefore to propose an electrical cabinet in which electrical devices can be cooled effectively, even if the electrical cabinet is ingress protected, and in which it is possible that some electrical devices which do not need to be cooled are not cooled or are cooled only a little.

EXPLANATION OF THE INVENTION

This aim is achieved through an electrical cabinet comprising a front part and a rear part, and intended to receive functional electrical units each comprising a support and a plurality of electrical devices arranged on the support, said electrical cabinet also comprising:
- means for fastening said functional electrical units, said fastening means being arranged to receive said functional electrical units on a separation plane delimiting a first space situated toward the front part and a second space situated toward the rear part,
- a partition dividing the second space into a first subspace situated toward the front part and a second subspace situated toward the rear part, the partition being arranged in the electrical cabinet to form at least two passages enabling an airflow to circulate between the first subspace and the second subspace,
- a cooling source intended to be arranged in contact with said airflow.

According to a particular feature, the electrical cabinet comprises a functional ventilation unit fastened on the fastening means and comprising a ventilation system situated in the first subspace.

According to another particular feature, the electrical cabinet comprises a functional ventilation unit fastened on the fastening means and comprising a ventilation system situated in the first space.

According to another particular feature, the cooling source comprises heat exchange fins situated in the second subspace.

According to another particular feature, the partition comprises heat exchange fins situated in the second subspace.

According to another particular feature, the electrical cabinet comprises at least two functional electrical units mounted along the separation plane and an opening formed between the two functional electrical units.

According to another particular feature, a functional electrical unit comprises an electrical device passing through the separation plane so as to have a first part situated in the first space and a second part situated in the first subspace. The second part of the electrical device comprises, for example, a ventilation system.

According to another particular feature, the second part of the electrical device comprises a bearing surface positioned against the partition.

According to another particular feature, the electrical cabinet comprises a cooling unit fastened on the fastening means.

According to another particular feature, the cooling unit comprises a heat exchange module passing through the separation plane and the partition.

According to another particular feature, the volume of the first space is greater than the volume of the second space.

BRIEF DESCRIPTION OF THE FIGURES

Other features and advantages will emerge from the following detailed description, given in light of the attached drawings in which.

DETAILED DESCRIPTION OF AT LEAST ONE EMBODIMENT

Figure 6:
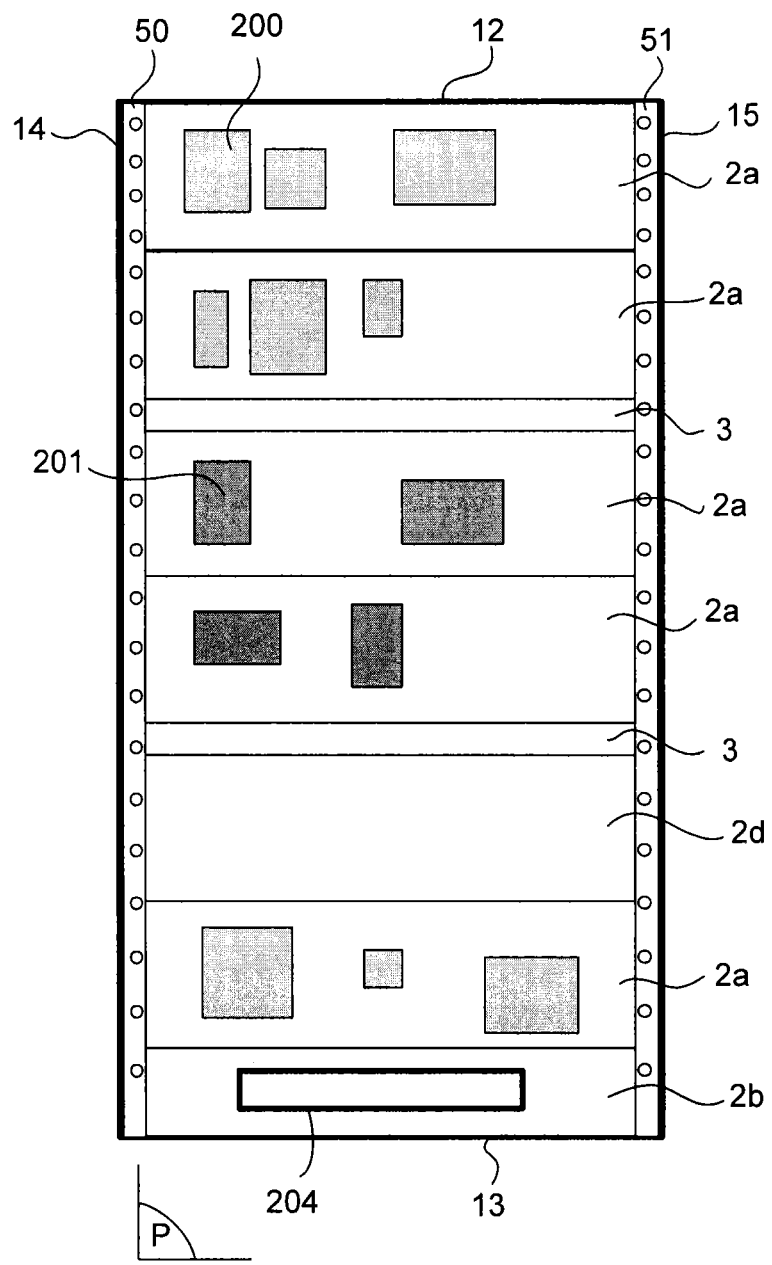
FIG. 6 shows a front view of the interior of the electrical cabinet.

The invention relates to an electrical cabinet 1. The electrical cabinet 1 is preferentially of parallelepipedal form. Obviously, a cylindrical cabinet with circular section or having a section of a different shape could perfectly well be envisaged. Hereinafter in the description, the focus will be on an electrical cabinet of parallelepipedal form. The electrical cabinet thus comprises a front wall 10, a rear wall 11, a top wall 12, a bottom wall 13 and two side walls 14, 15 (visible in FIG. 6).

The electrical cabinet 1 of the invention will notably be able to be ingress protected, for example conforming to the standard IEC 60529 with an index IP55. The heat dissipation solution described below is perfectly suitable for cooling electrical devices housed in an ingress-protected electrical cabinet of this type, but it should be understood that it can be adapted to a non-ingress-protected cabinet or one with a different level of ingress protection.

The front wall 10 of the electrical cabinet 1, comprises, for example, a door for accessing the interior of the cabinet.

Inside, the electrical cabinet 1 comprises fastening means intended to accommodate different functional units, notably functional electrical units 2a, functional ventilation units 2b and/or functional cooling units 2c. These functional units are combined in the cabinet by taking into account applications to be controlled or monitored and various constraints, notably thermal constraints.

Each functional unit 2a, 2b, 2c comprises a support 20 designed to be fastened on fastening means and one or more elements fastened on the support 20 to fulfill, for example, control and command, ventilation or cooling functions.

A functional electrical unit 2a should be understood to be a functional unit which comprises one or more electrical devices, such as, for example, a circuit breaker, an electromechanical contactor, a motor starter, a variable speed drive, a starter, a filter or a braking resistor. Electrical devices of this type are, for example, combined in a functional electrical unit 2a according to their function and/or their thermal characteristics. Certain functional electrical units 2a comprise only electrical control/command devices 200, which do not necessarily need to be cooled whereas other functional electrical units may comprise power electrical devices 201 which are likely to heat up a lot and which must therefore be cooled.

According to the invention, the fastening means consist, for example, of two parallel vertical uprights 50, 51 (FIG. 6), between which can be fastened each support 20 of each functional unit 2a, 2b, 2c. The two vertical uprights are positioned in a plane, called separation plane P, which is parallel to the front 10 and rear 11 walls of the electrical cabinet 1. The functional units are fastened on the fastening means on the separation plane P. Functional units 2, 2b, 2c can be positioned adjacently along the separation plane P so as to form a separation wall between a first space E1 situated toward the front part of the electrical cabinet 1 and a second space E2 situated toward the rear part of the electrical cabinet 1. Functional shutting units 2d (FIG. 1), bearing no device or element, can also be provided to form a complete separation wall over the entire height of the electrical cabinet 1. Obviously, to vary the volumes of the two spaces E1, E2, the position, depthwise, of the uprights, and therefore of the separation wall, can be adapted.

Preferentially, the first space E1 has a greater volume than that of the second space E2.

According to the invention, the electrical cabinet 1 also comprises, in the second space E2, a partition C extending along a vertical plane parallel to the separation plane P. This partition C thus makes it possible to divide the second space E2 into a first subspace E20 situated toward the front part of the electrical cabinet 1 and a second subspace E21 situated toward the rear part of the electrical cabinet 1. The position of this partition can be adjusted depthwise to be able to vary the volumes of the two subspaces E20, E21. This partition C is fastened inside the electrical cabinet 1 so as to leave at least two passages P1, P2 enabling an airflow to circulate between the first subspace E20 and the second subspace E21. Preferentially, a first passage P1 is formed at the top of the electrical cabinet 1 and a second passage P2 is formed in the bottom of the electrical cabinet. The partition C comprises a front face Cs1 situated on the side of the first subspace E20 of the second space and a rear face Cs2 situated on the side of the second subspace E21 of the second space. The position of the partition C can also be adjusted heightwise so as to be able to vary the size of the passages P1, P2.

According to the invention, each functional unit support 20 fastened on the fastening means has two faces parallel to the separation plane P, a front face situated on the side of the first space E1 and a rear face situated on the side of the first subspace E20 of the second space.

Figure 1:
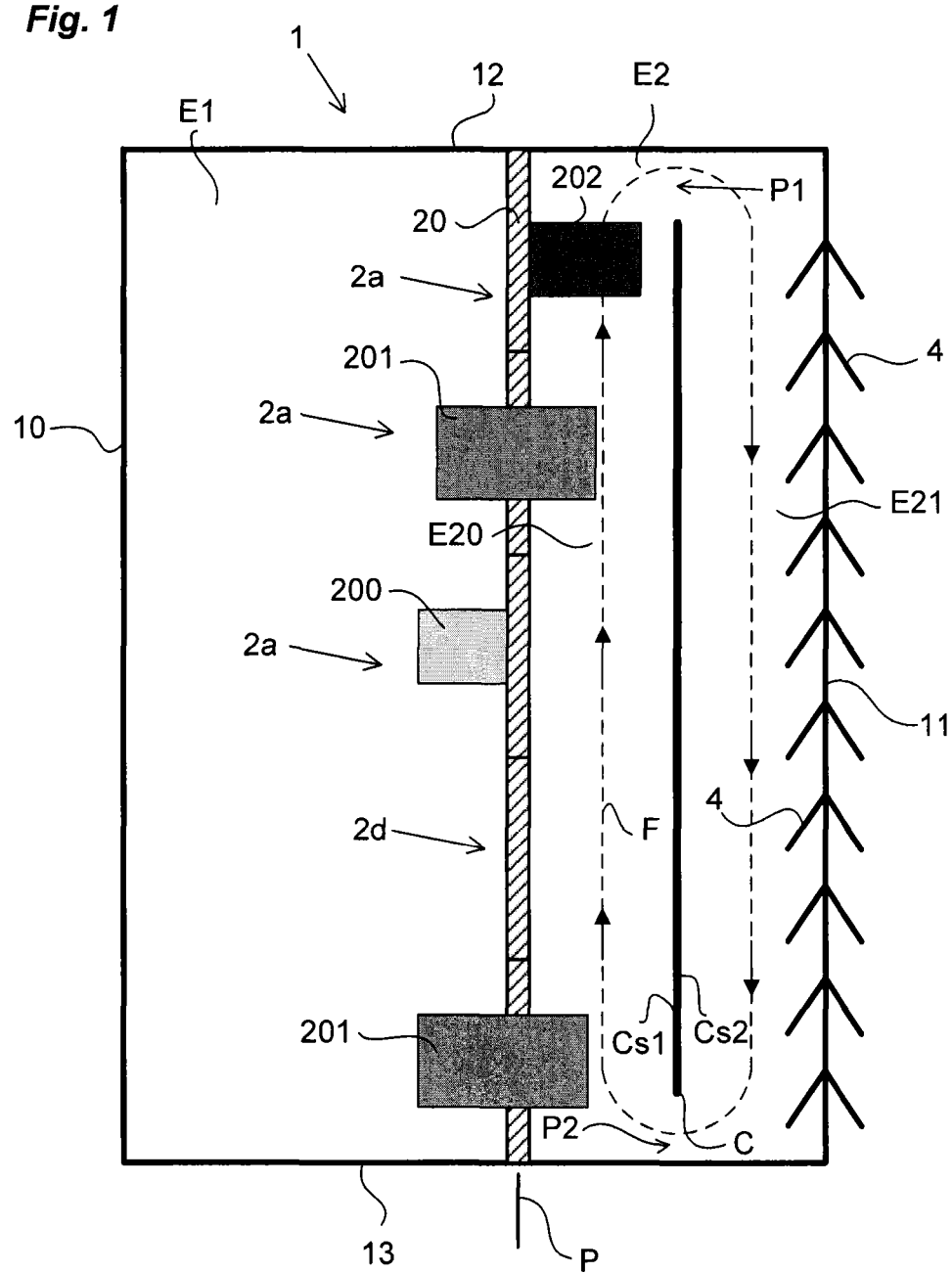
FIG. 1 shows a side view of the interior of the electrical cabinet of the invention, according to a first configuration.

Referring to FIG. 1, depending on the type of electrical device employed on the functional electrical units 2a, various arrangements are possible:

some electrical devices are entirely situated in the first space E1, that is to say fastened on the front face of the support 20 of the functional electrical unit 2a. These electrical devices present in the first space E1 are, for example, control/command devices 200 such as circuit breakers or electromechanical contactors.

Some electrical devices are situated only in the first subspace E20 of the second space, that is to say fastened on the rear face of the support 20 of the functional electrical unit 2a. These electrical devices 202 present only in the first subspace E20 of the second space are, for example, smoothing inductors or braking resistors.

Some electrical devices will be able to pass through their support 20 so as to have a first part situated in the first space E1 and a second part situated in the first subspace E20 of the second space. These electrical devices situated partly in the first space and in the first subspace of the second space are, for example, power devices 201 of the variable-speed drive type, the control part of the variable speed drive being situated at the front and the power part provided with the power transistors situated at the rear. The power part will notably be able to comprise an integrated ventilation system.

According to the invention, the internal volume of the electrical cabinet 1 can thus be divided into three distinct thermal zones:

a cold zone formed by the first space E1 because it is intended to receive electrical devices or parts of devices which do not heat up or heat up very little, a heating zone formed by the first subspace E20 of the second space because it is intended to receive devices or parts of devices which heat up, a cooling zone formed by the second subspace E21 of the second space because it is in contact with a cooling source, for example formed by the walls of the cabinet (rear 11 and side walls), which are in contact with the ambient air, the built of a machine or with the cold zone of an adjacent electrical cabinet.

According to the invention, an airflow F is thus created between the heating zone and the cooling zone, this airflow circulating from one zone to the other through the two passages P1, P2 defined above.

According to the invention, the electrical cabinet 1 can comprise heat exchange fins 4 placed on different walls so as to increase the heat exchange surface area. The heat exchange fins 4 are oriented in the direction of circulation of the airflow F. Referring to the figures, heat exchange fins 4 can thus be positioned on the rear wall 11 of the electrical cabinet 1, on the outer face thereof and/or on the inner face thereof. Heat exchange fins 4 can also be positioned on the partition C, on the rear face Cs2 thereof. The latter group of heat exchange fins 4 is of interest when the rear of an electrical device is fastened on the front face Cs1 of the partition C (FIG. 3).

In a first configuration represented in FIG. 1, in which the separation wall is present over the entire height of the electrical cabinet 1, this airflow F is kept in the second space E2 and circulates between the first subspace E20 of the second space and the second subspace E21 of the second space.

Figure 2:
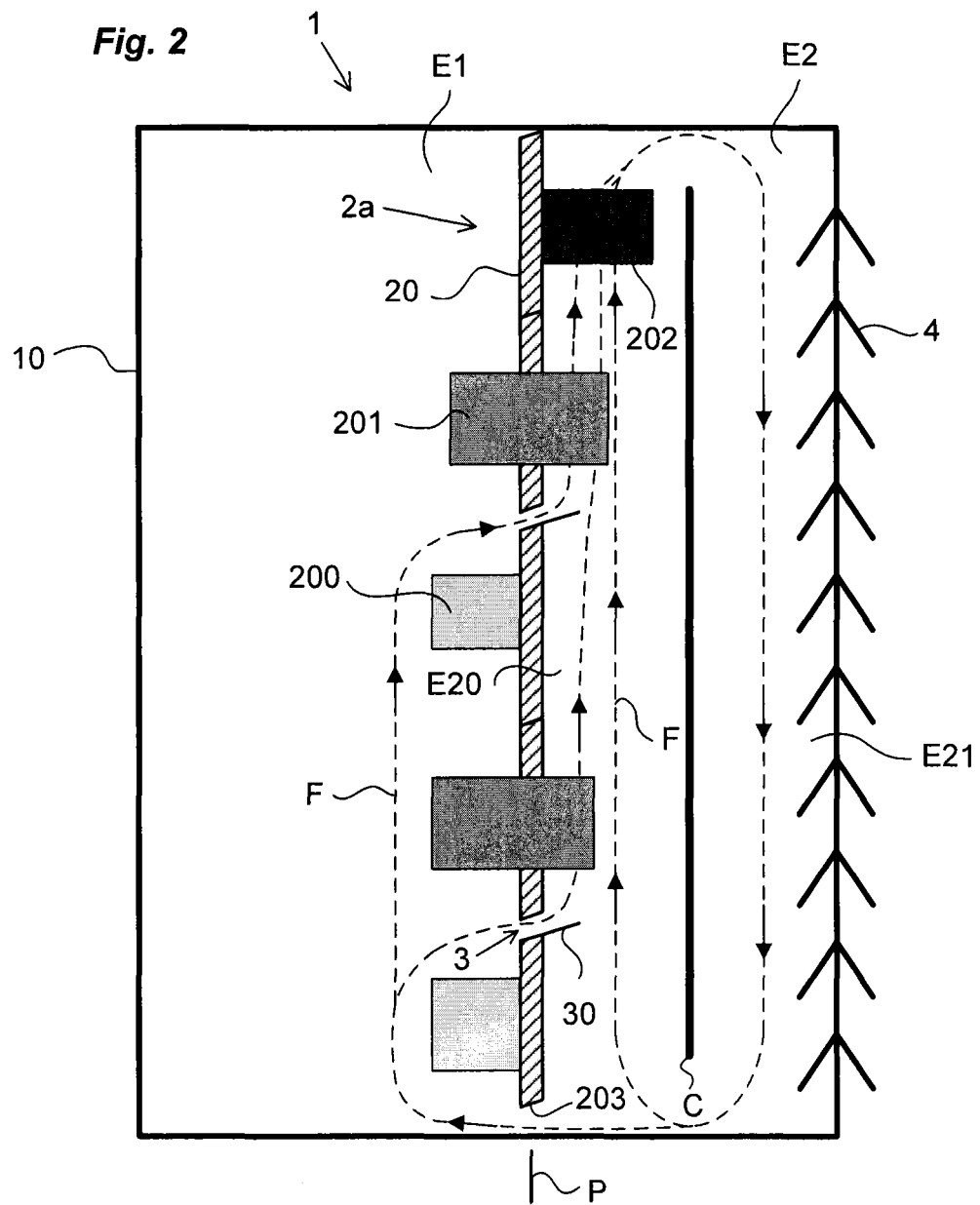
FIG. 2 shows a side view of the interior of the electrical cabinet of the invention, according to a second configuration.

In a second configuration represented in FIG. 2, openings 3 are distributed between certain functional units to connect the first space E1 with the second space E2. The airflow F can therefore also circulate from the cold zone to the heating zone through one or more openings 3. The airflow F also sweeps over the electrical devices situated only in the first space E1. Preferentially, the top edge and the bottom edge of each support 20 of a functional unit can be beveled, the bevels 203 being oriented in the direction of circulation of the airflow F. Thus, when an opening 3 is deliberately created between two functional units, the airflow F circulates more easily between the first space E1 and the first subspace E20 of the second space. A circulation fin 30 can also be provided on the opening 3 to better orient the airflow F. In this airflow, the hot airflow present in the first subspace E20 is returned toward the rear whereas the cooling airflow is directed directly toward the hot part of the power device (201 or 202) or its embedded heat dissipation system. Through the heating in the first subspace E20, the speed of circulation of the hot air in the first subspace E20 is greater than that of the cooled air; thus, the cooled air is sucked by venturi effect and the higher the temperature gradient, the greater the speed of circulation of the airflow. A self-regulation is thus created which depends on the temperature gradient and also on the respective air volumes of the spaces E1, E20 and E21 of the electrical cabinet.

Figure 3:
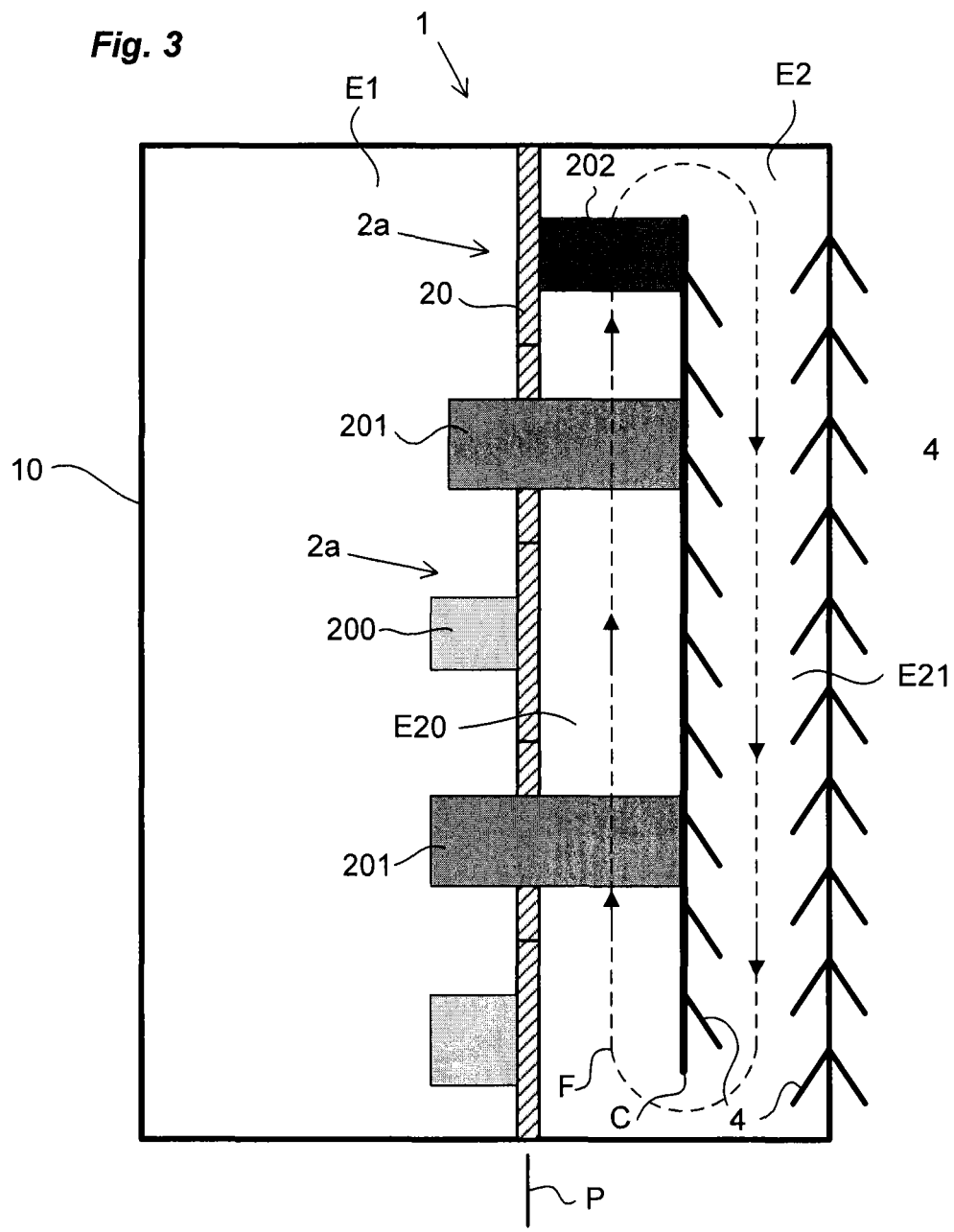
FIG. 3 shows a side view of the interior of the electrical cabinet of the invention, according to a third configuration.

According to another configuration represented in FIG. 3, when the dissipated power is greater, the hot points of the devices are directly glued to the partition C, the latter serving as a radiator.

Figure 4:
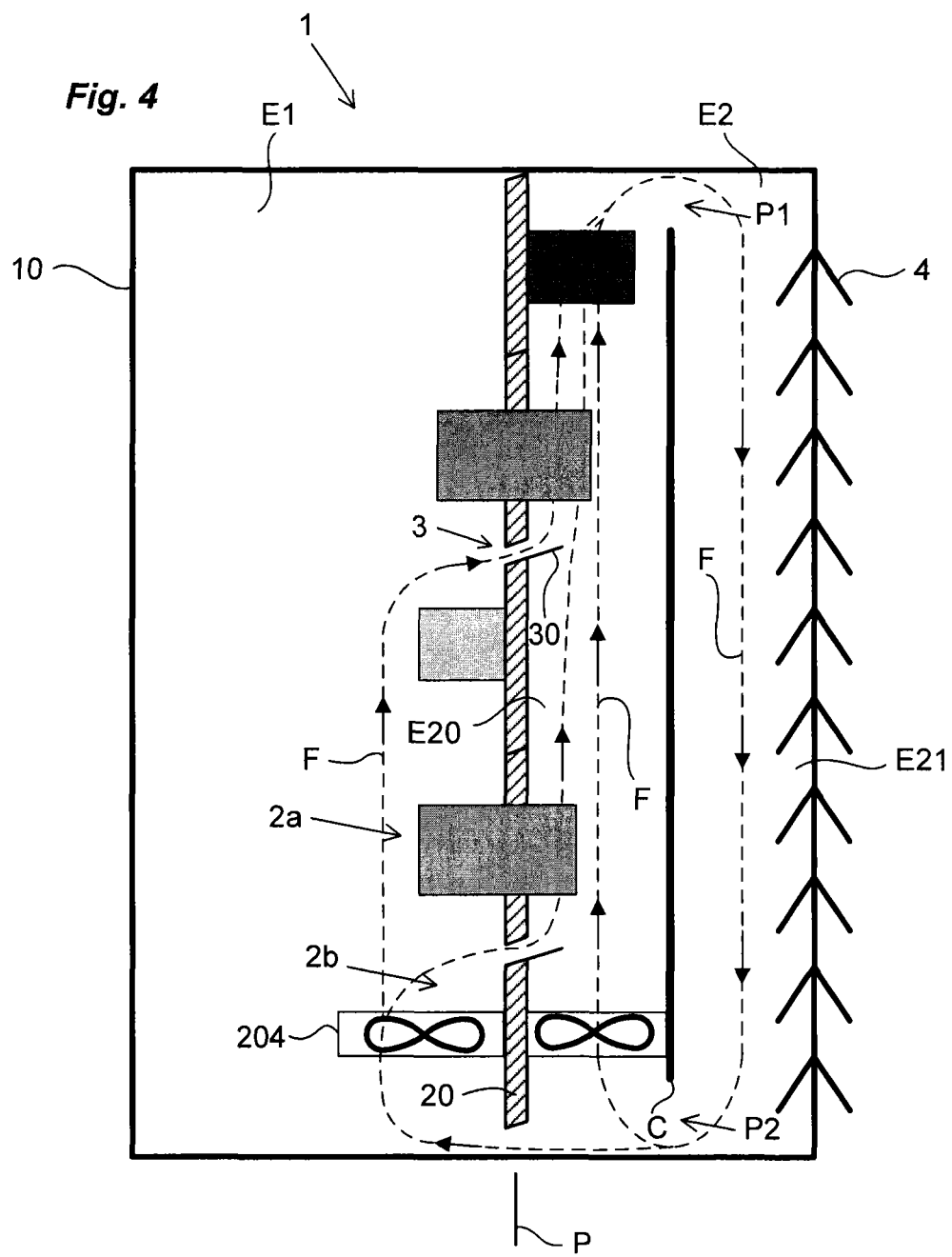
FIG. 4 shows a side view of the interior of the electrical cabinet of the invention, according to a fourth configuration.

According to another configuration represented in FIG. 4, to facilitate the circulation of the airflow F between the heating zone and the cooling zone or between the heating zone and the cold zone, the electrical cabinet 1 can comprise 1 or more functional ventilation units 2b. These functional ventilation units 2b can comprise one or more ventilation systems 204. A functional unit of this type is fastened on the fastening means of the electrical cabinet 1 and comprises a ventilation system 204 fastened either on the front face of its support 20, or on the rear face of its support 20, or a ventilation system fastened on each face of its support 20 (FIG. 4).

Figure 5:
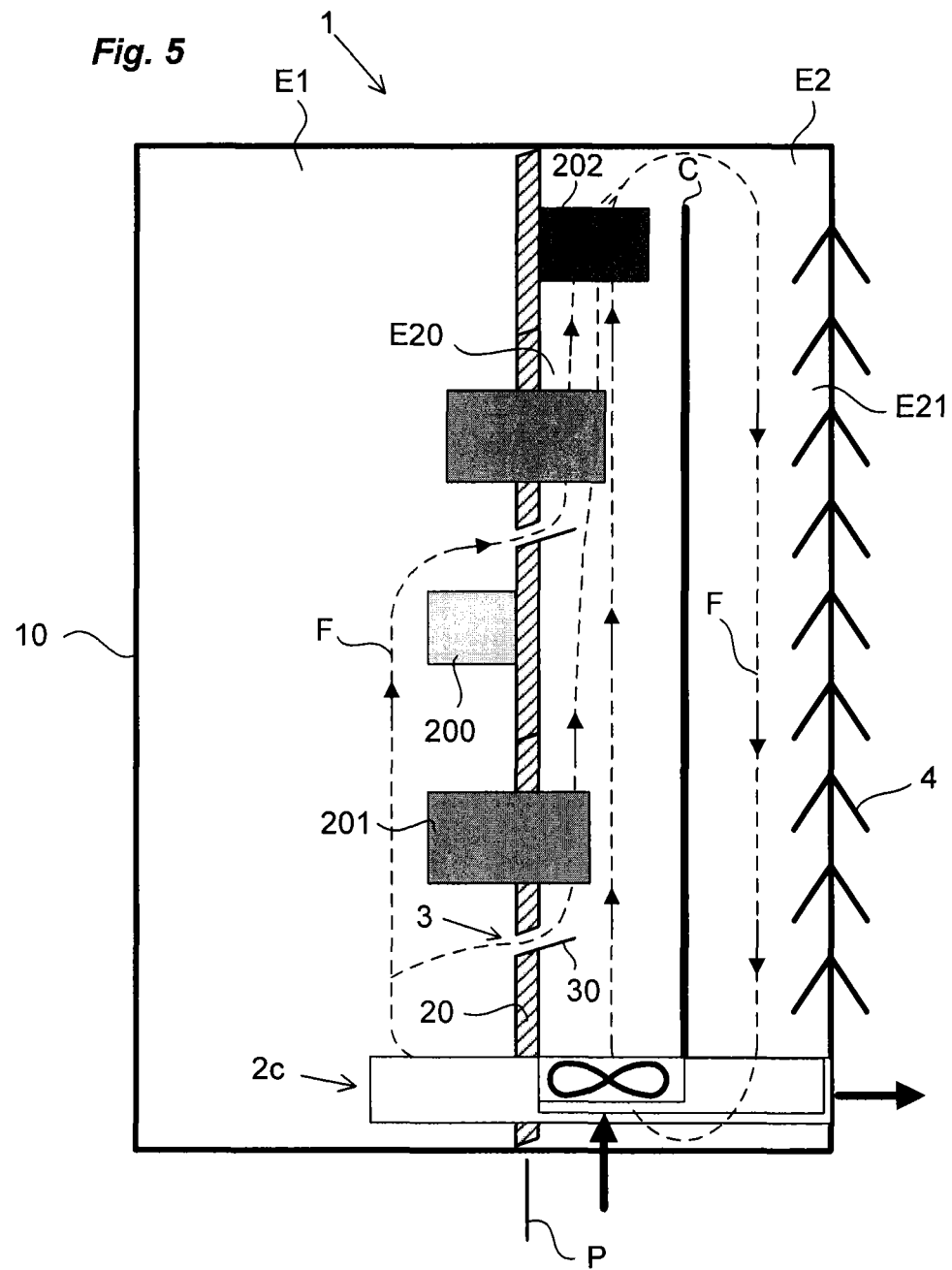
FIG. 5 shows a side view of the interior of the electrical cabinet of the invention, according to a fifth configuration.

According to another configuration represented in FIG. 5, the electrical cabinet 1 can also comprise a functional cooling unit 2c comprising a heat exchange module. This functional cooling unit 2c makes it possible to improve the cooling of the air in the electrical cabinet 1. The heat exchange module is, for example, positioned through the separation plane P and the partition C so as to receive the airflow F originating from the cooling zone to cool this airflow F and to reinject it into the heating zone and into the cold zone. Another configuration can obviously be envisaged.

According to the invention, the various features of the electrical cabinet 1 presented above in the different configurations represented in the figures can perfectly well be combined with one another to adapt to the electrical devices housed in the electrical cabinet, to the situation and to the environment of the electrical cabinet.

The invention claimed is:

1. An electrical cabinet comprising:
a front part and a rear part;
a plurality of functional electrical units, each of the plurality of functional electrical units includes a support and a plurality of electrical devices arranged on the support;
means for fastening the plurality of functional electrical units, the fastening means configured to secure two or more of the functional electrical units on a separation plane in the electrical cabinet, the two or more supports of the respective two or more functional electrical units are provided immediately adjacent each other so that the two or more supports form a separation wall in a height direction of the electrical cabinet, the separation wall delimiting a first space situated toward the front part and a second space situated toward the rear part, wherein at least one of the electrical devices is located in the first space and at least one of the electrical devices is located in the second space;
a partition dividing the second space into a first subspace situated toward the front part and a second subspace situated toward the rear part, the partition configured in the electrical cabinet to form at least two passages enabling an airflow to circulate between the first subspace and the second subspace such that airflow in the first subspace flows along and is in contact with the at least one of the electrical devices located in the second space extending into the first subspace; and
a cooling source configured to be arranged in contact with the airflow.

2. The electrical cabinet as claimed in claim 1, further comprising a functional ventilation unit fastened on the fastening means and including a ventilation system situated in the first subspace.

3. The electrical cabinet as claimed in claim 1, further comprising a functional ventilation unit fastened on the fastening means and including a ventilation system situated in the first space.

4. The electrical cabinet as claimed in claim 1, wherein the cooling source comprises heat exchange fins situated in the second subspace.

5. The electrical cabinet as claimed in claim 1, wherein the partition comprises heat exchange fins situated in the second subspace.

6. The electrical cabinet as claimed in claim 1, comprising at least two functional electrical units mounted along the separation wall separated from each other in the height direction of the electrical cabinet,
wherein one or more openings are formed in the separation wall respectively between the at least two functional electrical units that are separated from each other in the height direction.

7. The electrical cabinet as claimed in claim 1, wherein at least one of the functional electrical units includes an electrical device passing through the separation plane to have a first part situated in the first space and a second part situated in the first subspace.

8. The electrical cabinet as claimed in claim 7, wherein the second part of the electrical device comprises a ventilation system.

9. The electrical cabinet as claimed in claim 1, wherein the second part of the electrical device comprises a bearing surface positioned against the partition.

10. The electrical cabinet as claimed in claim 1, further comprising a functional cooling unit fastened on the fastening means.

11. The electrical cabinet as claimed in claim 10, wherein the functional cooling unit comprises a heat exchange module passing through the separation plane and the partition.

12. The electrical cabinet as claimed in claim 1, wherein a volume of the first space is greater than a volume of the second space.

* * * * *